United States Patent
Zaloom et al.

(10) Patent No.: US 6,924,085 B2
(45) Date of Patent: Aug. 2, 2005

(54) PHOTORESIST COATINGS FOR COPPER CLAD STAINLESS STEEL PRINTING PLATES

(75) Inventors: Jeffrey George Zaloom, Waukesha, WI (US); Zhengzhe Song, Vernon Hills, IL (US)

(73) Assignee: Printing Developments, Inc., Racine, WI (US)

( * ) Notice: Subject to any disclaimer, the term of this patent is extended or adjusted under 35 U.S.C. 154(b) by 143 days.

(21) Appl. No.: 10/390,980

(22) Filed: Mar. 18, 2003

(65) Prior Publication Data

US 2004/0185376 A1 Sep. 23, 2004

(51) Int. Cl.[7] ............... G03F 7/012; G03F 7/30; B41N 1/08; B41M 3/00
(52) U.S. Cl. ............ 430/302; 430/167; 430/277.1; 101/451; 101/459; 101/463.1
(58) Field of Search ............... 430/167, 277.1, 430/302; 101/451, 459, 463.1

(56) References Cited

U.S. PATENT DOCUMENTS

| | | | | |
|---|---|---|---|---|
| 4,631,245 A | * | 12/1986 | Pawlowski | 430/175 |
| 4,659,649 A | * | 4/1987 | Dickinson et al. | 430/280.1 |
| 5,252,431 A | * | 10/1993 | Yoshida et al. | 430/303 |
| 5,637,428 A | * | 6/1997 | Horie et al. | 430/49 |
| 5,962,192 A | | 10/1999 | Holman, III et al. | 430/302 |
| 6,037,085 A | * | 3/2000 | Holman et al. | 430/18 |
| 6,329,122 B2 | * | 12/2001 | Hotta et al. | 430/278.1 |
| 6,397,749 B1 | * | 6/2002 | Kita et al. | 101/457 |
| 6,653,042 B1 | * | 11/2003 | Fukino et al. | 430/270.1 |
| 6,664,019 B2 | * | 12/2003 | Zaloom et al. | 430/167 |

* cited by examiner

*Primary Examiner*—John S. Chu
(74) *Attorney, Agent, or Firm*—Arthur J. Plantamura

(57) ABSTRACT

A copper clad metal printing plate can be coated with an azide-containing photoresist comprising a polyformal resin together with a modified polyformal resin that has up to 100% of its hydroxyl groups converted to carboxyl groups, an organo azide and a photosensitive dye that absorbs light at the frequency of a patterning laser and converts it to heat energy. This de-crosslinks the resin that has been exposed to the laser light. Preferably the photoresist is flood exposed with ultraviolet light prior to laser exposure. The photoresist becomes soluble in the laser-exposed areas, exposing the underlying copper after development. The printing plates are completed by etching away the copper in the exposed areas, removing the remaining photoresist, thereby providing a patterned copper layer on the printing plate.

6 Claims, No Drawings

PHOTORESIST COATINGS FOR COPPER CLAD STAINLESS STEEL PRINTING PLATES

This invention relates to a photoresist coating for metal printing plates. More particularly, this invention relates to a photoresist coating for copper clad stainless steel printing plates and to the resultant coated and developed printing plates.

BACKGROUND OF THE INVENTION

Photopolymers are used to make either positive-working or negative-working patterns on various substrates. Solvent-developable photopolymers are a particular class of photopolymers that have the ability to either become more soluble, or less soluble, when exposed to light of a particular wavelength. Positive photopolymers become more soluble, and negative photopolymers become less soluble, in a developer solution after pattern exposure. Thus after exposure, as through a patterned mask, and development of the photoresist with a solvent, a like or opposite pattern of the photoresist remains on the substrate. This developed or patterned photopolymer layer can then be used to prevent the action of a corrosive liquid or etchant (or etch gas when plasma etching is employed) from reacting with, and removing, portions of the substrate not protected by the photopolymer.

In the printing plate art, photoresists are also used to form an image on a substrate, which is generally a metal plate. Ink is applied to the plate having a patterned photoresist layer thereon, and the ink can be transferred to another medium, such as paper for example. This process is well known.

U.S. Pat. No. 5,962,1912 discloses a photoresist for a copper clad aluminum printing plate. A photoresist is applied over the copper layer, and exposed to laser light of a desired frequency only certain areas of the photoresist are exposed to the laser light. The laser light decomposes the azide in those areas exposed to the light; the unexposed regions are then cross linked by flood exposure from a UV lamp, which hardens the photroresist. However, the preferred method is to crosslink the photoresist by UV flood exposure prior to laser exposure. Then the printing plate is developed by solubilizing the laser-exposed regions of the substrate, exposing the underlying copper layer. This exposed copper layer is then etched away. After removal of the exposed copper, a stencil ink is applied to the copper remaining on the aluminum plate mounted on a press, where the pattern is transferred to another medium, such as paper or metal.

The above photoresist then is a positive photoresist, made of an organoazide compound mixed with a suitable film-forming polymer resin, such as polyvinyl formal, and a dye sensitive to the region of the spectrum emitted by the exposing laser. These ingredients are mixed with suitable organic solvents to make a photoresist composition that is sensitive to the laser light, in particular to 830 nm.

Although we do not wish to be bound by any particular theory, we believe the laser light is converted to heat energy by the dye, which is present in an amount sufficient to de-crosslink the photoresist film. The photoresist compositions can be patterned by direct application of a computer controlled laser beam to form finely controlled patterns. Thus these photoresists can be used to transfer patterns directly from a computer, via a computer controlled light beam, to a substrate such as a printing plate.

With the generation of patterns generated by a computer, a laser light source is computer controlled to generate the pattern to a printing plate. The laser scans across the plate, and the computer turns the laser on and off to pattern expose the photoresist. This eliminates the step of making a mask of the desired pattern, and, because the laser light can be finely controlled, an exact amount and frequency of the light exposure of the photoresist, and improved accuracy of the pattern formed, can be obtained.

The metal decorating printing industry uses stainless steel printing plates as the preferred substrate instead of aluminum plates because such plates have a longer life and they are an improvement over aluminum for direct printing of colored patterns on metal, such as for trays, bottle caps, cookie tins and the like. However, the present photoresists are inadequate for stainless steel substrates because they peel off during the processing of the plate. Thus an improved photoresist for decorating metal articles is a desirable commercial advance.

SUMMARY OF THE INVENTION

In accordance with the present invention, organoazide photoresists can be made having much improved adhesion to stainless steel substrates by adding a modified polyformal resin component to the photoresist mixture. This modified polyformal resin has up to 100% of its hydroxyl (—OH) units converted to carboxylic units (—COOH). The resultant photoresist exhibits improved adhesion to a copper clad stainless steel printing plate.

DETAILED DESCRIPTION OF THE INVENTION

Copper clad stainless steel printing plates are highly desirable, particularly for the metal decorating industry because, in addition to the traditional benefits of copper clad aluminum bimetal printing plates, copper clad stainless steel plates are exceptionally durable, they have unsurpassed pattern quality, they use less ink, and they do not require baking. Traditional copper clad aluminum printing plates, when used to directly print inks onto metal substrates, stress the aluminum, eventually causing cracks and tears in the printing plates.

Copper clad stainless steel plates, on the other hand, are strong, flexible and re-usable, that is, they are able to withstand repeated handling and mounting. These plates come to color quickly, thus reducing substrate waste and ink usage; they can also take two to three times more ink density than other printing plates, with little plugging of ink in fine screens, with the result that colors are brighter and more vibrant, and black is blacker.

Further, the use of stainless steel printing plates eliminates the need for any baking steps, as is required for prior art printing plates. This reduces the pre-press and on-press variables experienced by systems that require baking, such as pre-bake imaging problems and post-bake cracking that contribute to production downtime and consequent increased costs.

The positive photoresists useful herein comprise an organoazide compound mixed with a modified polymeric polyformal resin composition, a dye that is sensitive to light of a particular frequency, i.e., that of the laser light, such as 830 nm; and that is soluble in a photoresist solvent. Pigments can also be added to improve the contrast between the photoresist layer and the underlying substrate. The addition of surfactants, designed to adjust the texture of the photoresist, forms a smooth coating having a uniform thickness on a substrate. Typically, lithographic photoresist films have a dry thickness of about 0.5–2 micrometers.

The above ingredients are mixed with a suitable organic solvent, so that it can be applied, as by spinning, in conventional manner. Such a spun thin film has a uniform thickness on a substrate. Generally the solids are dissolved to a concentration of about 5% by weight in the organic solvent., Polymeric resins suitable herein include polyformal resins that have been reacted with an organic anhydride. Desirably, from about 5% up to 100% of the hydroxyl groups in the polyformal resin are reacted to form the corresponding carboxylic functionality. Suitable anhydrides include hydrocarbons, such as succinic anhydride, aromatic anhydrides, such as phthalic anhydride, and unsaturated hydrocarbon anhydrides such as maleic anhydride.

Suitable organo azide compounds include mono- or multi-functional compounds having more than one azide group. Suitable azides include monoaryl and vinyl azides, and arylazides, which can be substituted by various halogen and other radicals. Suitable azide compounds include azido bis(2,6-benzylidene)cyclohexanone, butane diol di(4-azidotetrafluorobenzoate), methyl 4-azidotetrafluorobenzoate, azobis(2-methylpropionitrile) and the like. These organoazide compounds can be used together with dyes that are photosensitive to the light emitted by the particular laser used for patterning the resist.

It is believed that a high intensity laser light source excites electrons in the dye absorbers, so that the laser light is transformed into heat energy. This heat energy in turn is transmitted to the cross-linked polymeric photoresist, converting it to a more soluble material in the developing solvents.

Thus the dye chosen for the present photoresists must be sensitive to the frequency of the laser used for exposure of the photoresist, and must be able to absorb the radiation from the laser and convert the radiation to heat. Various dyes are known that are sensitive to infrared light, or other light, but what is important here is that the dye be sensitive in the same region of the spectrum as the light emitted by the patterning laser light source.

The addition of suitable pigments to the present photoresist compositions can provide improved visual contrast between the photoresist film and the underlying substrate. The pigment may be insoluble in the photoresist solution, but then it must be dispersable in the solvent, and it must not absorb light at the frequency of the patterning laser. The improved contrast provided by the pigments permits ready information on when development of the photoresist is complete.

The present photoresist compositions are made by mixing the modified polyvinyl formal resin with unmodified resin. Then an organic azide and one or more laser sensitive dyes or dye enhancers are mixed together. The mixture is then dissolved in a suitable organic solvent. Suitable solvents include dimethylacetamide, xylene and the like. Additional ingredients such as surfactants, coating agents, pigments and the like can also be added.

After preparation of the photoresist composition, it is applied in known manner, as by spin coating, to a printing plate substrate, i.e., the copper clad stainless steel printing plates useful herein, and dried.

The photoresist coated printing plate is then image exposed to a computer controlled laser light. A suitable light source should deliver about 150–200 mJ/cm$^2$ of light to the photoresist layer in a short period of time. Each region of the plate should be exposed by a flash of light of a few microseconds or less. Various lasers can be employed that emit light in the infrared region, such as diode lasers, YAG lasers, $CO_2$ lasers and the like. Other lasers, such as those that emit in the visible region of the spectrum can also be used, providing the dye added to the photoresist is able to convert light of that wavelength into heat energy. The laser light is absorbed by the photoresist, which becomes more soluble in the photoresist developer in areas exposed to the laser light.

The exposed photoresist is then developed using conventional developer solutions and equipment. The developer solubilizes the exposed regions of the photoresist and washes it away, as by spray washing. If a pigment is used, the determination of when the photoresist has been removed down to the substrate in the image-exposed areas is also easier.

After development, the exposed portions of the substrate printing plate are etched; the exposed copper layer is etched away down to the stainless steel substrate in the areas no longer covered by the photoresist. This transfers the desired pattern to the underlying stainless steel substrate.

After etching away the exposed copper, the remaining phororesist is stripped in known manner, and the substrate washed and dried. The copper areas remaining will adsorb printing inks, which can be transferred to particular media, such as metal, cardboard, plastics or blankets and the like.

The invention will be further described in the following examples, but the invention is not meant to be limited to the details described herein. In the examples, percent is by weight.

EXAMPLE 1

Polyformal (3.6%) and modified polyformal resin (0.34%) were stirred together in dimethylacetamide (54.3%) for one hour. Additional photoresist ingredients, e.g., azidobis(2,6-benzylidene)cyclohexanone (0.34%); an infrared dye, Projet 830 (0.33%); a fluorocarbon surfactant, FC-431, available from 3M Company (0.03%); a color enhancer, Chromadye 18, available from Chroma Chemicals, that changes color during pattern exposure to infrared light (0.06%); and 41.9% of xylene were added and the resulting mixture stirred for about three hours.

The resultant photoresist was coated onto both a copper clad aluminum printing plate and a copper clad stainless steel printing plate at a spin speed of 57 rpm, dried for two minutes in an oven set to 270° F. and exposed using a computer controlled diode laser that emits light having a frequency of 830 nm, at a dose of 150–200 joules/cm$^2$ for 3 microseconds.

The printing plates were developed using Printing Development Inc's (hereinafter PDI) 195 CTP developer solvent in a spray developer system. This exposed portions of the copper layer on both printing plates.

The exposed copper was then etched away using a copper etchant, PDI's "Q Etch"®. Excellent adhesion of the photoresist to both printing plates was obtained. The remaining photoresist layer was stripped with a suitable solvent, such as PDI's 434S Stencil remover, to leave a copper pattern on the printing plates.

EXAMPLE 2

The procedure of Example 1 was followed except using 0.09% of methyl red dye, 0.07% of Chromadye 18, and 4.09% of polyvinyl formal mixed with 0.40% of modified polyformal resin. The resulting printing plates were exposed and processed according to Example 1.

The photoresists were applied both to conventional copper clad aluminum printing plates, and to copper clad stainless steel printing plates.

Excellent adhesion of the photoresist to both plates was achieved.

EXAMPLE 3

The procedure of Example 2 was followed except using as the dye 0.13% of Sudan Red dye (made by Pfaltz & Bauer, Inc). This photoresist also demonstrated excellent adhesion to copper clad aluminum and copper clad stainless steel printing plates.

The present photoresists have a high resolution of 2400 dpi; and they take only 3–5 minutes of processing time. The tonal curve can be adjusted either digitally or chemically during processing; they have excellent latent image stability, and they can be safely stored in white light with a shelf life of at least one year. The photoresists of the invention are non-hazardous and non-caustic. No pre- or post-baking is required.

The stainless steel plates are highly durable, particularly when abrasive inks and substrates are used; and they can make millions of impressions throughout the life of the plate. Further, they can be employed in sizes of up to 43.5 inches per side, by any length, and they reduce ink consumption over conventional aluminum printing plates. These factors mitigate the somewhat increased cost of the stainless steel plates.

Although the invention has been described in terms of particular embodiments, the invention is not to be so limited; the invention is only to be limited by the scope of the appended claims.

We claim:

1. A method of forming a printing plate comprising
   a) adding a modified polyformal resin to polyformal to form a solution;
   b) adding an organic azide compound and a dye that absorbs in the infrared region of the spectrum to form a photoresist solution;
   c) coating a copper clad printing plate with a layer of said photoresist solution;
   d) pattern exposing the photoresist layer with a laser that emits light having a frequency in the infrared region of the spectrum that is absorbed by the dye and thereby converted to heat energy that de-crosslinks the photoresist; and
   e) contacting the resultant exposed photoresist layer with a developer solvent that solubilizes the exposed photoresist to leave a pattern of non-exposed photoresist on said printing plate.

2. A method according to claim 1 wherein said laser is computer controlled.

3. A method according to claim 1 wherein said substrate is a copper clad stainless steel printing plate.

4. A method according to claim 3 wherein the copper cladding in said exposed areas is etched away.

5. A method according to claim 4 wherein the photoresist is partially removed to provide a patterned copper layer on said metal printing plate.

6. A process for printing a pattern on an article comprising etching the printing plate formed by the method of claim 1 and imprinting on said article with said now exposed pattern.

* * * * *